(12) United States Patent  (10) Patent No.: US 7,560,769 B2
Sandhu et al.  (45) Date of Patent: Jul. 14, 2009

(54) NON-VOLATILE MEMORY CELL DEVICE AND METHODS

(75) Inventors: Gurtej S. Sandhu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 11/498,523

(22) Filed: Aug. 3, 2006

(65) Prior Publication Data
US 2008/0121969 A1  May 29, 2008

(51) Int. Cl.
H01L 29/788 (2006.01)
(52) U.S. Cl. ............... 257/321; 257/316; 257/E29.168; 257/E29.071
(58) Field of Classification Search ......... 257/310, 257/315, 321, 406, 104; 365/100, 185; 438/142–308, 438/400–454
See application file for complete search history.

(56) References Cited

U.S. PATENT DOCUMENTS

| | | | |
|---|---|---|---|
| 5,714,766 A * | 2/1998 | Chen et al. ............. | 257/17 |
| 6,319,774 B1 | 11/2001 | Hai | |
| 6,331,463 B1 * | 12/2001 | Chen ..................... | 438/257 |
| 6,762,093 B2 | 7/2004 | Rudeck | |
| 6,906,377 B2 | 6/2005 | Ni et al. | |
| 6,970,053 B2 | 11/2005 | Akram et al. | |
| 7,005,697 B2 | 2/2006 | Batra et al. | |
| 7,057,940 B2 | 6/2006 | Hsu et al. | |
| 2003/0153151 A1 * | 8/2003 | Choi et al. ............. | 438/257 |
| 2003/0218214 A1 * | 11/2003 | Tsuchiya et al. ....... | 257/350 |
| 2003/0235064 A1 * | 12/2003 | Batra et al. ............ | 365/100 |
| 2004/0026682 A1 * | 2/2004 | Jiang ..................... | 257/4 |
| 2004/0137704 A1 | 7/2004 | Kim et al. | |
| 2004/0224534 A1 | 11/2004 | Beulens et al. | |
| 2005/0067659 A1 | 3/2005 | Gutsche et al. | |

(Continued)

FOREIGN PATENT DOCUMENTS

EP  1 411 555 A2  4/2004

(Continued)

OTHER PUBLICATIONS

IC Knowledge, LLC, "Technology Backgrounder: Atomic Layer Deposition", pp. 7 (2004).

(Continued)

*Primary Examiner*—Lex Malsawma
*Assistant Examiner*—Robert Huber
(74) *Attorney, Agent, or Firm*—Brooks, Cameron & Huebsch, PLLC

(57) ABSTRACT

A method of fabricating a memory cell including forming nanodots over a first dielectric layer and forming a second dielectric layer over the nanodots, where the second dielectric layer encases the nanodots. In addition, an intergate dielectric layer is formed over the second dielectric layer. To form sidewalls of the memory cell, a portion of the intergate dielectric layer and a portion of the second dielectric layer are removed with a dry etch, where the sidewalls include a location where a nanodot has been deposited. A spacing layer is formed over the sidewalls to cover the location where a nanodot has been deposited and the remaining portion of the second dielectric layer and the nanodots can be removed with an isotropic etch selective to the second dielectric layer.

23 Claims, 8 Drawing Sheets

U.S. PATENT DOCUMENTS

| | | |
|---|---|---|
| 2005/0095786 A1 | 5/2005 | Chang et al. |
| 2005/0202639 A1 | 9/2005 | Yoo et al. |
| 2005/0287717 A1* | 12/2005 | Heald et al. .................. 438/128 |
| 2006/0003531 A1 | 1/2006 | Chang et al. |
| 2006/0014329 A1 | 1/2006 | Park et al. |
| 2006/0081911 A1 | 4/2006 | Batra et al. |
| 2006/0086970 A1* | 4/2006 | Kim ........................... 257/321 |
| 2006/0110870 A1 | 5/2006 | Bhattacharyya |
| 2006/0186462 A1* | 8/2006 | Han et al. ................... 257/315 |
| 2006/0202254 A1* | 9/2006 | Lai et al. .................... 257/315 |

FOREIGN PATENT DOCUMENTS

| | | |
|---|---|---|
| EP | 1 418 625 A1 | 5/2004 |
| EP | 1 437 775 A2 | 7/2004 |
| EP | 1 737 033 A1 | 12/2006 |
| WO | WO 2005/036599 A2 | 4/2005 |
| WO | WO 2005/101488 A1 | 10/2005 |
| WO | WO 2006/007069 A2 | 1/2006 |

OTHER PUBLICATIONS

Winkler, O, et al. "Semiconductor Nanocrystals vol. 1", Silicon nanodot fabrication and application in nonvolatile memories, B. Podör, et al., eds, pp. 190-196 (Sep. 2005).

International Search Report, mailed Jul. 8, 2008 (7 pgs).

* cited by examiner

NON-VOLATILE MEMORY CELL DEVICE AND METHODS

BACKGROUND

Nanodots may be used in a wide variety of optical devices including light emitting diodes (LEDs), laser diodes (LDs), and photodetectors. Nanodots may also be used in single electron transistors. Through the use of nanodots, it may be possible to improve the performance of a device by reducing the threshold current of the device, improving retention characteristics, and/or increasing the optical gain.

For example, when a plurality of nanodots are distributed throughout a floating gate of a flash memory device, the voltage required for storing information may be smaller than the current required for a conventional flash memory device having no nanodots, and thus, the amount of power consumed may be decreased by using the nanodot device. The improved characteristics exhibited by the nanodot device may be attributed to Coulomb blockage at room temperature when nanodots smaller than about ten (10) nanometer (nm) in diameter are used for a floating gate, with the result that a threshold voltage shift may be quantized and multi-bit information may be stored. Accordingly, nanodot technology is considered promising for next-generation technology.

The size of semiconductor memory devices, and the thin dielectric films that are used in these devices, has been scaled down in order to accommodate the diminishing feature size of elements on a chip. One problem with the continued scaling down in floating gate memory devices is that the charge retention characteristics of the devices are very sensitive to the presence or absence of defects in the tunnel oxide. A reduction in the thickness of the tunnel oxide, to allow for further scaling down, increases the risk of defects occurring in the tunnel oxide.

DETAILED DESCRIPTION

Figure 1A:
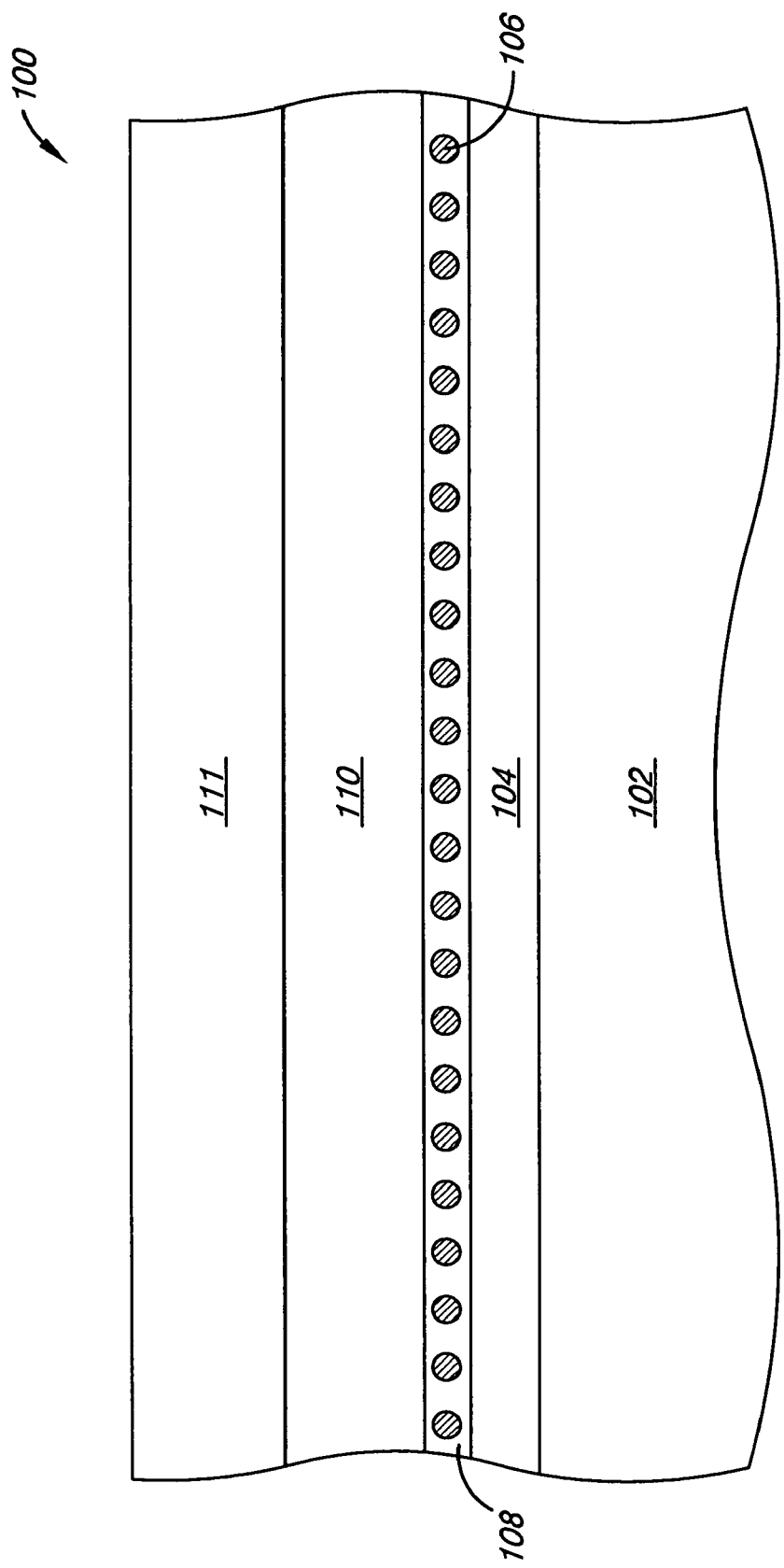
FIGS. 1A-1E illustrate cross-sectional views of a portion of a memory array during various stages of fabrication in accordance with an embodiment of the present disclosure.

To accommodate the diminishing feature size of elements on a chip, one approach has been to store the charge in a floating gate comprised of a plurality of nanodots instead of a monolithic floating gate. This plurality of nanodots strongly reduces the sensitivity of the device to incidental defects in the tunnel oxide. In such a situation, when a defect is present, a nanodot immediately adjacent the defect might lose its charge or be unable to charge but the other nanodots are not affected.

Flash memory is one form of a nonvolatile memory having a floating gate and will be referred to for illustrative purposes throughout this specification. Nevertheless, embodiments of the present disclosure are not limited to flash memory cells and can be embodied in an alternate form of non-volatile memory cell having a floating gate.

The term "substrate" or "substrate assembly" used in the following description may include a number of semiconductor-based structures that have an exposed semiconductor surface. Structure can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "substrate" in the following description, previous process steps may have been utilized to form regions or junctions in or on the semiconductor structure and/or foundation. When reference is made to a substrate assembly, various process steps may have been previously used to form or define regions, junctions, various structures or features, and openings such as capacitor plates or barriers for capacitors.

As used herein, "layer" can refer to a layer formed on a substrate using a deposition process. The term "layer" is meant to include layers specific to the semiconductor industry, such as "barrier layer," "dielectric layer," and "conductive layer." The term "layer" is also meant to include layers found in technology outside of semiconductor technology, such as coatings on glass.

In the Figures, the first digit of a reference number refers to the Figure in which it is used, while the remaining two digits of the reference number refer to the same or equivalent parts of embodiment(s) of the present disclosure used throughout the several figures of the drawing. The scaling of the figures does not represent precise dimensions and/or dimensional ratios of the various elements illustrated herein.

Embodiments of the present disclosure will now be described in detail with reference to the accompanying figures. It should be noted that although the figures illustrate only one memory cell, the semiconductor structures contemplated herein can have more than one memory cell.

In some embodiments, a method of fabricating a memory cell stack can include depositing nanodots over a first dielectric layer and forming a second dielectric layer over the nanodots, where the second dielectric layer encases the nanodots. In addition, an intergate dielectric layer can be formed over the second dielectric layer and patterned to form sidewalls to the memory cell stack. To form the sidewalls, a portion of the intergate dielectric layer and a portion of the second dielectric layer can be removed with a dry etch, where the sidewalls can include a location where a nanodot has been deposited. A spacing layer can be formed over the sidewalls to cover the location where a nanodot has been deposited. The remaining exposed portions of the second dielectric layer and exposed nanodots can be removed with an isotropic etch selective to the second dielectric layer, e.g., the isotropic etch removes the nanodots more aggressively than the second dielectric layer.

In some embodiments, a memory cell includes a floating gate formed by nanodots in a dielectric layer above a channel region without a presence of voids at a location where a nanodot had been deposited, but had subsequently been removed in processing or fabrication, between a control gate layer and the channel region. In such embodiments, an intergate dielectric layer can be between the nanodots and the control gate layer.

Figure 1B:
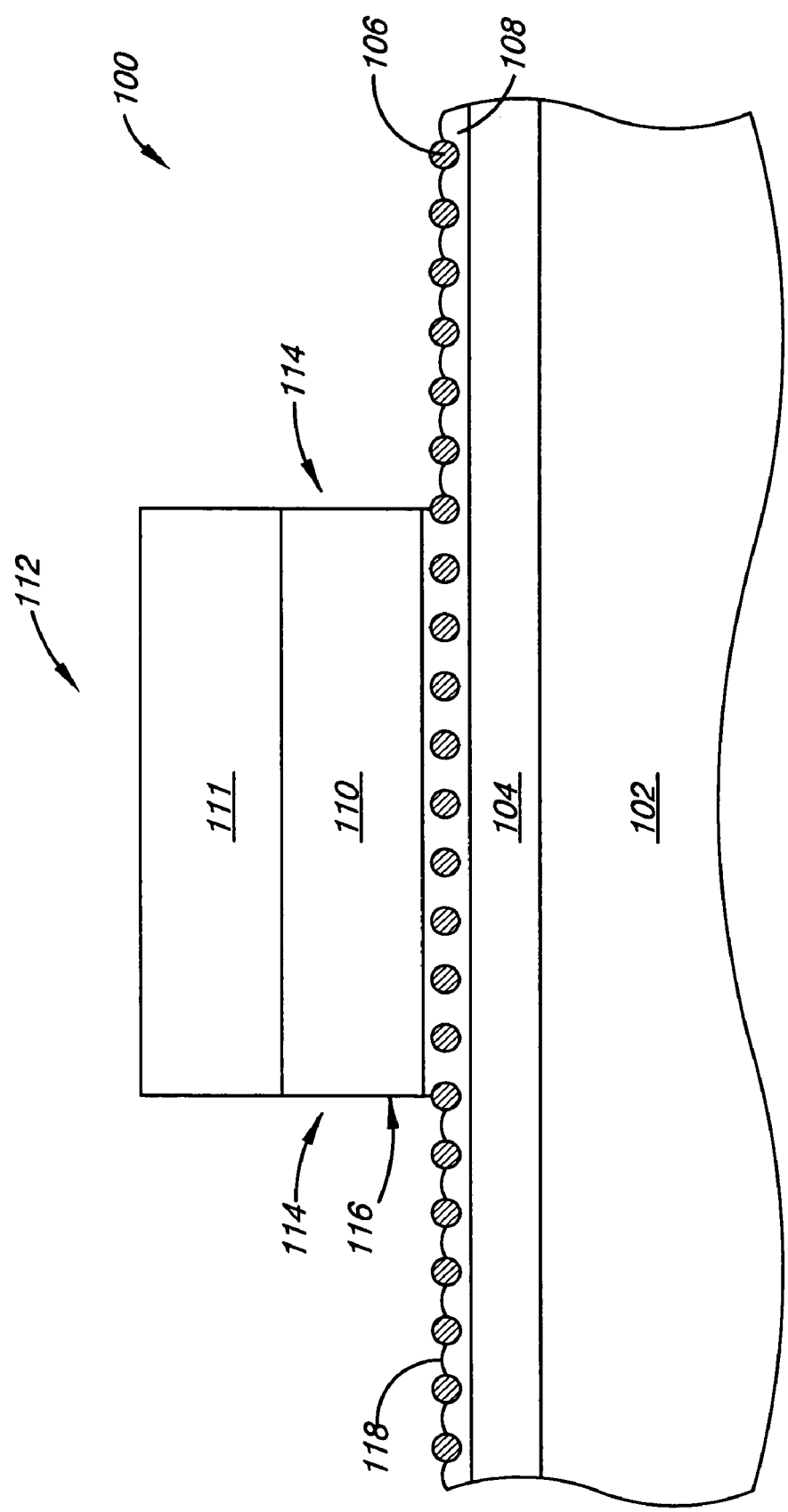
Figure 1C:
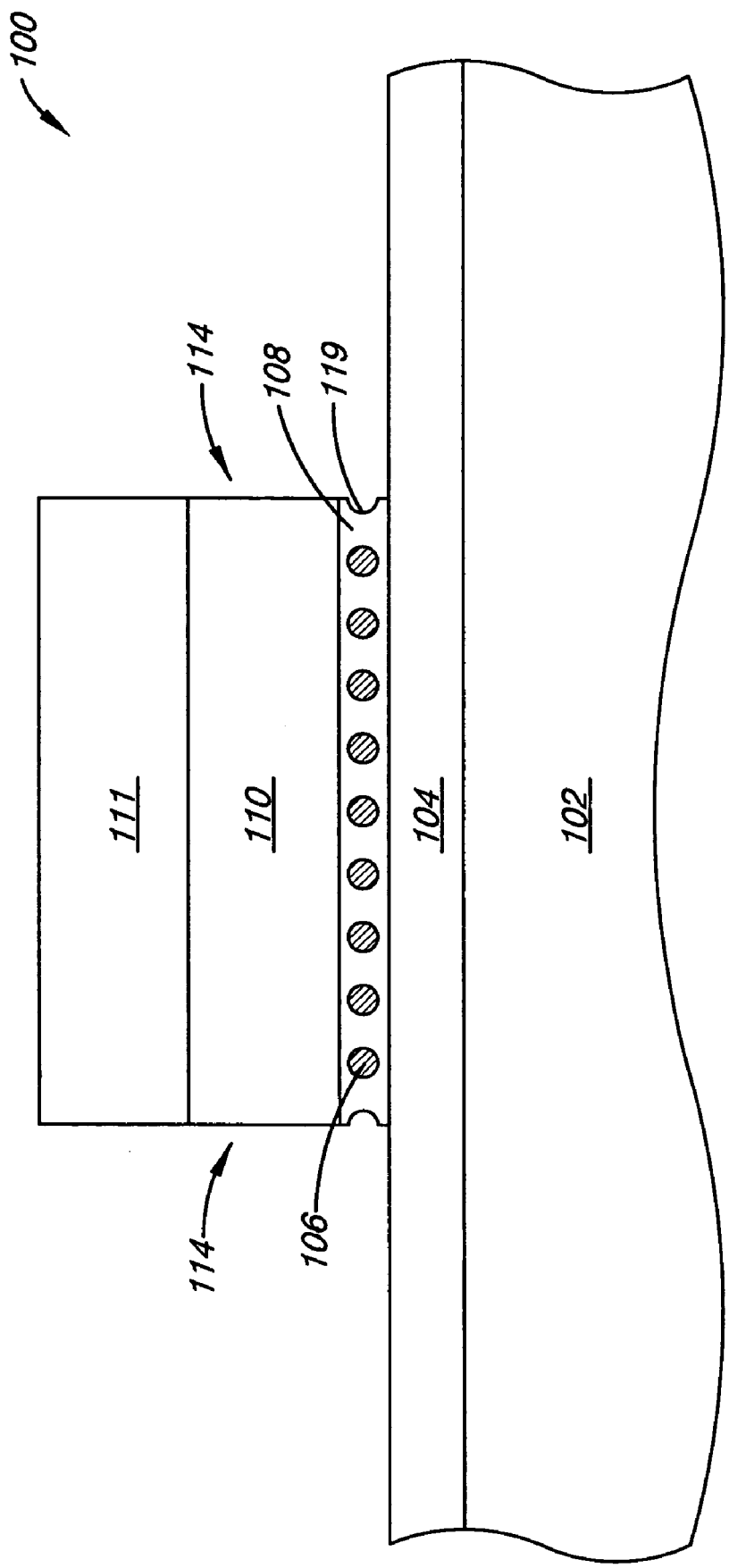
Figure 1D:
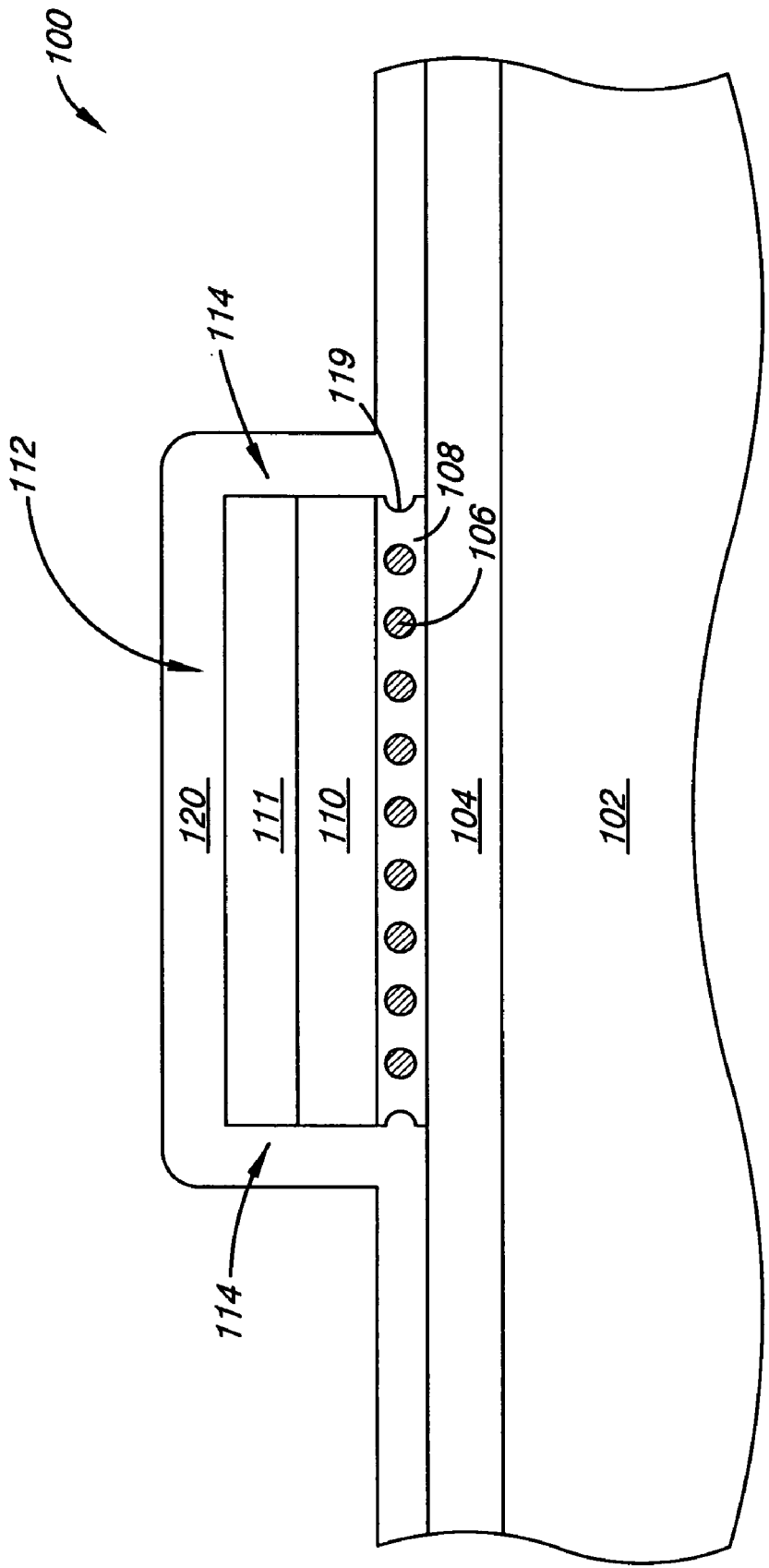
Figure 1E:
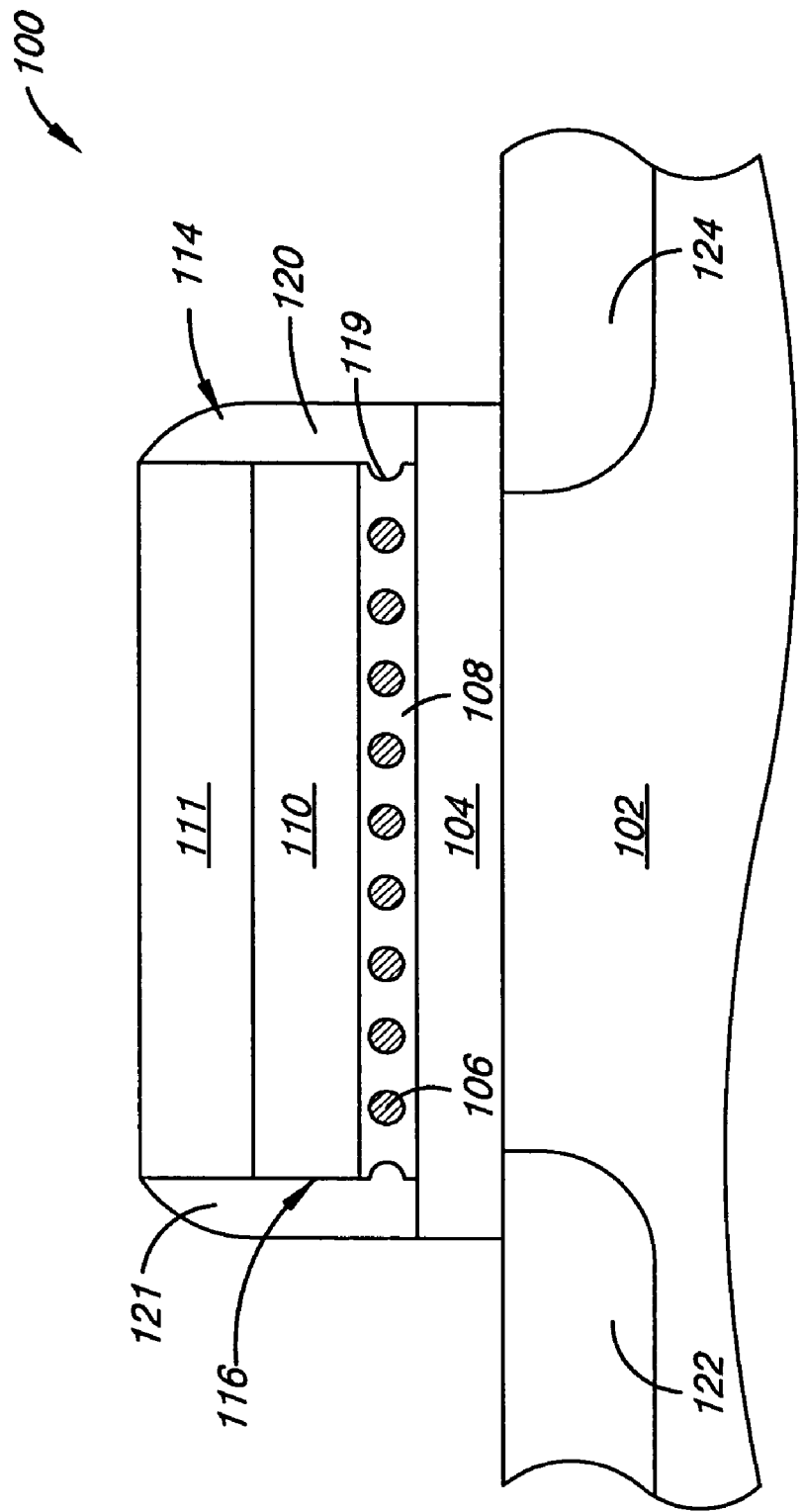

FIGS. 1A through 1E illustrate an exemplary embodiment of a method of fabricating a memory cell including a nanodot layer and a spacer and the resulting device (FIG. 1E). FIG. 1A shows a cross-sectional view of a portion of a memory cell, indicated with reference numeral 100, shown without a patterned control gate structure. The device 100 includes a substrate 102. In one embodiment, the substrate 102 can be made from silicon. For example, the substrate 102 can be a p-type silicon substrate (for forming an n-channel storage device). In some embodiments, the substrate 102 can be an SOI substrate 102. In other embodiments, the substrate 102 can include gallium arsenide (GaAs) or other semiconductor materials including, but not limited to: Si, Ge, SiGe, InAs, InP, CdS, CdTe, other III/V compounds, and the like.

As shown in FIG. 1A, a first dielectric layer 104 is formed over the substrate 102. In some embodiments, the first dielectric layer 104 can be a tunnel oxide layer. In such embodiments, the first dielectric layer 104 can be formed of a material such as silicon dioxide ($SiO_2$), and can be formed with a method such as thermal oxidation. Thermal oxidation includes heating the substrate 102 in an oxygen ambient at high temperature (e.g., 800° C. to about 1100° C.) until the oxide is formed on the surface of the substrate 102. It is also possible to form the first dielectric layer 104 by deposition processes such as, but not limited to, chemical vapor deposition (CVD) and plasma vapor deposition (PVD), etc.

In some embodiments, the first dielectric layer 104 can be formed of a high constant dielectric and/or a stack of layers including at least one barrier layer and at least one high constant dielectric layer. If a high constant dielectric layer is used, in some embodiments a barrier layer is formed between the high constant dielectric layer and the substrate 102.

In one embodiment, the thickness of the first dielectric layer 104 can depend upon the material selected and/or programming voltages to be used with the resulting memory cell 100. For example, in some embodiments, the first dielectric layer 104 formed of silicon dioxide can have a thickness of less than ten (10) nanometers (nm). In some embodiments, the first dielectric layer 104 can have a thickness of at least two (2) nm. In other embodiments, the first dielectric layer 104 can have a thickness in the range from two (2) nm to four (4) nm.

As discussed herein, the nanodots 106 of the present disclosure are used to form the floating gate of a memory cell device 100. In some embodiments, the nanodots 106 can have a size in the range of two (2) to five (5) nm in diameter. In addition, the nanodots can be provided over the first dielectric layer 104 by chemical vapor deposition (CVD). Alternatively, in one embodiment, the nanodots 106 can also be deposited via atomic layer deposition (ALD) and/or physical vapor deposition (PVD).

To prevent the destabilization of the memory structure, the nanodots 106 are formed of materials that are essentially non-reactive. In some embodiments, the nanodots 106 can be formed of a metal. In such embodiments, the nanodots 106 can be formed of a metal selected from a group consisting of platinum, ruthenium, rhodium, iridium, chromium, titanium, molybdenum, tungsten, and/or osmium. In various embodiments the nanodots 106 can be formed of a material that has a melting point of at least one thousand six hundred (1600) degrees Celsius (° C.). In some embodiments, the nanodots 106 can be formed of a semiconductor. The use of other materials for the nanodots 106 is also possible.

In one example embodiment, nanodots 106 made of platinum can be deposited using a chemical vapor deposition process where, for example, (trimethyl)-methylcyclopentadienyl platinum (IV) is reacted with oxidizing gases such as $O_2$ and $N_2O$ at about 380-420° C. to deposit platinum on the first dielectric layer 104 which self-forms as nanodots 106 on the tunnel oxide layer 104. Further, the substrate 102 can be annealed at a temperature of from about two hundred (200)° C. to about eight hundred (800)° C., in the presence of nitrogen ($N_2$) or oxygen ($O_2$) in a vacuum atmosphere to convert the platinum to platinum nanodots. Furthermore, the nanodots 106 may be composed of materials such as Rhodium (Rh) and Ruthenium (Ru), which upon oxidation stay conductive, utilizing the processing steps described herein.

In one example embodiment, a second dielectric layer 108 can be formed over the nanodots 106. In some embodiments, the second dielectric layer 108 can be formed over the nanodots 106 by CVD. Since the nanodots 106 can be formed to be separate and isolated, the second dielectric layer 108 can be formed interstitially between the nanodots 106, encasing the nanodots 106 in the second dielectric layer 108.

In some embodiments, the second dielectric layer 108 can be made from an advanced dielectric, for example, tantalum pent-oxide ($Ta_2O_5$), $BaSrTiO_3$, hafnium oxide ($HfO_2$), or zirconium dioxide ($ZrO_2$), which have very high dielectric constants (about twenty-five (25) or greater) when deposited. As used herein, an advanced dielectric is a dielectric which allows device scaling below 0.1 µm. Advanced dielectric materials are useful for maintaining and/or increasing the amount of energy at a given voltage that each device can store, thereby reducing operating voltages.

In some embodiments, the first dielectric and second dielectric layer 104, 108, comprise a composite layer. Although not shown, in such embodiments, a barrier layer of silicon dioxide layer can be formed over the second dielectric layer 108 when the second dielectric layer 108 comprises an advanced dielectric.

As shown in the example embodiment of FIG. 1A, an intergate dielectric layer 110 can be deposited on the second dielectric layer 108. In some embodiments, the intergate dielectric layer 110 can be a silicon nitride layer. In addition, in such embodiments the silicon nitride layer can be deposited by LPCVD. Also, in one embodiment, a control gate layer 111 can be deposited on the intergate dielectric layer 110. The control gate layer 111 can be formed of tantalum nitride (TaN), titanium nitride (TiN), or poly-silicon ($p^+$), among other materials.

FIG. 1B illustrates a structure embodiment of the memory cell 100 after a next sequence of processing steps. For example, FIG. 1B illustrates the memory cell 100 structure after the intergate dielectric layer 110 and control gate layer 111 has been patterned and etched to form a portion of a memory cell stack 112. In one embodiment, the control gate layer 111, the intergate dielectric layer 110, and a portion of the second dielectric layer 108 are masked and patterned into a gate stack 112, forming a sidewall 114. Suitable techniques for removing (e.g., etching) the layers to form the gate stack 112 can include etching techniques such as, but not limited to: reactive ion etching (RIE), plasma etching, and ion beam etching. In one embodiment, the gate stack 112 is formed by a dry etch. Suitable gases that can be employed in the dry etching process include: $CHF_3$, $CF_4$, $CHF_4$, $SF_6$, or $NF_3$, and combinations thereof. The gases may also be used in conjunction with oxygen or an inert gas such as nitrogen or helium. Other dry etch techniques are also possible to etch the gate stack 112 and form the sidewall 114.

In one embodiment, the dry etch removes a portion of the second dielectric layer 108 and exposes the nanodots 106. In addition, in some embodiments, a sidewall 114 is formed having a planar surface 116 approximately perpendicular to the etched surface 118 of the second dielectric layer 108. In such embodiments, the planar surface 116 of the sidewall 114 can contain a location where a nanodot 106 has been deposited 119, shown as such in FIG. 1B.

FIG. 1C illustrates an embodiment of the memory cell stack 112 after the next sequence of processing steps. According to various embodiments, using a second dielectric layer 108 with a thickness of ten (10) nm or less, an anisotropic etch may be used until the first dielectric layer 104 is reached. Then a selective isotropic etch can be used to more gracefully continue to etch so as not to etch through first dielectric layer 104. In some embodiments, the remaining portion of the second dielectric layer 108 and the nanodots 106 are etched using an isotropic etch. In such embodiments, the isotropic etch is selective to the dielectric layer 108. In other words, the etch rate for the nanodots 106 is higher compared to the etch rate for the second dielectric layer 108. In one embodiment, the isotropic etch is a wet etch. In an additional embodiment, the isotropic etch is a dry etch. However, since the isotropic etch is more aggressive towards the nanodots 106 as compared to the second dielectric layer 108, in some embodiments the sidewall 114 may have at least a portion of a hollow at a location where a nanodot 106 was previously deposited, but has been removed as a result of the selective isotropic etch. As used herein, a hollow can include a cavity, a gap, and/or a space in the second dielectric layer 108 where a nanodot 106 had previously resided. The hollow can form a void 119 in the second dielectric layer 108, where the presence of this void 119 can lead to and/or cause charge retention problems for the memory cell 100.

As discussed herein, defects in the second dielectric layer (e.g., 108) can cause charge retention problems when the floating gate is in the form of a solid layer rather than a nanodot layer. Similarly, the presence of the void 119, or portion of a void 119, between a control gate and a channel region of the non-volatile memory cell may cause data retention problems in the electron storage device 300. To prevent the loss of data retention, a spacing layer is used to plug and/or fill the void 119, as discussed herein. By filling the void 119 with a spacing layer, when a voltage is applied to the floating gate (i.e. the nanodots 106) to shift the threshold voltage of the device, the current is less likely to be disrupted by a void, or empty space 119, in the second dielectric layer 108. Therefore the excited electrons are more likely to be pushed through and trapped on the other side of the intergate dielectric layer 110, creating a barrier between the control gate and the floating gate formed by the nanodots 106, causing the memory cell to potentially shift in its detectable charged or uncharged state, e.g., from a value of one (1) to a value of zero (0).

Referring now to FIG. 1D, the memory cell 100 is shown including a spacing layer 120. In one embodiment, the spacing layer 120 can be blanket deposited over the gate stack 112 to cover the first dielectric layer 104, the sidewall 114, and the at least a portion of a void 119 previously occupied by a portion of a nanodot formed in the sidewall surface 116 using the isotropic etch.

The spacing layer 120 can be formed of various materials. In some embodiments, the spacing layer 120 is formed of a compound having etch stopping capabilities, for example, $Si_3N_4$. In various embodiments, the spacing layer 120 can be formed of $SiO_2$. In some embodiments, the spacing layer 120 can be formed of the same material as the second dielectric layer 108. In such embodiments, the spacing layer 120 can be formed of tantalum pent-oxide ($Ta_2O_5$), $BaSrTiO_3$, hafnium oxide ($HfO_2$), or zirconium dioxide ($ZrO_2$), as discussed herein.

In some embodiments, the spacing layer 120 can be deposited using a high conformality deposition step, for example atomic layer deposition (ALD). In such embodiments, the spacing layer 120 can be deposited without thermal treatment. In some embodiments, the spacing layer 120 can be deposited with thermal treatment at a temperature of up to nine hundred (900) degrees Celsius. The spacing layer 120 can also be deposited using a similar high conformality deposition step, for example, LPCVD and PECVD.

In some embodiments, the spacing layer 120 can have a thickness equal to at least the diameter of the nanodots 106. For example, as discussed herein, the nanodots can have a diameter in the range of two (2) to five (5) nm. It follows that in some embodiments, the spacing layer 120 can have a thickness in the range of two (2) to five (5) nm. In various embodiments, the spacing layer 120 can have a thickness (T) that is a function of the diameter (d) of the nanodots 106. In such embodiments, the function can be range from T=d to T=1.5d.

Referring now to FIG. 1E, the spacing layer 120 can be etched back to form sidewall spacers 121. As used herein, sidewall spacers 121 refer to the portion of the spacing layer 120 that remains after the spacing layer 120 is etched back. In one embodiment, the sidewall spacers 121 cover the sidewall surface 116 and the portion of the void 119 previously occupied by at least a portion of a nanodot 106. As discussed herein, the spacing layer 120 can be formed of nitride compounds which can have etch stopping capabilities. As shown in FIG. 1E, the first dielectric layer 104 can be etched while using the spacing layer 120 as a mask. In addition, source/drain regions 122, 124 can be formed by a suitable process, as processes for such implantation are used in the relevant industry. For example, in one embodiment, the source/drain regions 122, 124 are formed by ion-implantation of dopants into the substrate.

Figure 2A:
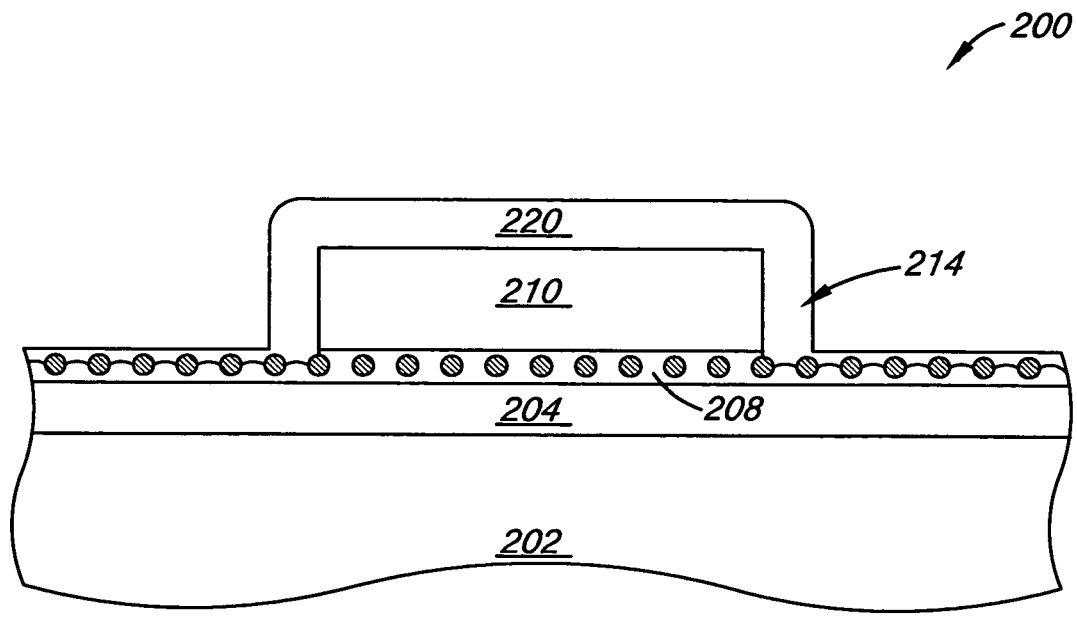
FIGS. 2A-2B illustrate cross-sectional views of a portion of a memory array during various stages of fabrication in accordance with an embodiment of the present disclosure.

As discussed herein, from the structure of FIG. 1B, different options to form the memory cell 100 of the present disclosure are available. FIG. 2A illustrates another sequence of processing steps continuing from the structure shown in FIG. 1B. As illustrated in FIG. 2A, in some embodiments, the spacing layer 220 can be deposited over the gate stack 212 between the dry etch and the isotropic etch. In such embodiments, the spacing layer 220 would be blanket deposited over the gate stack 212 to cover the first dielectric layer 204, the sidewall 214, and the location where a nanodot 206 has been deposited in the sidewall surface 216, as discussed herein.

Figure 2B:
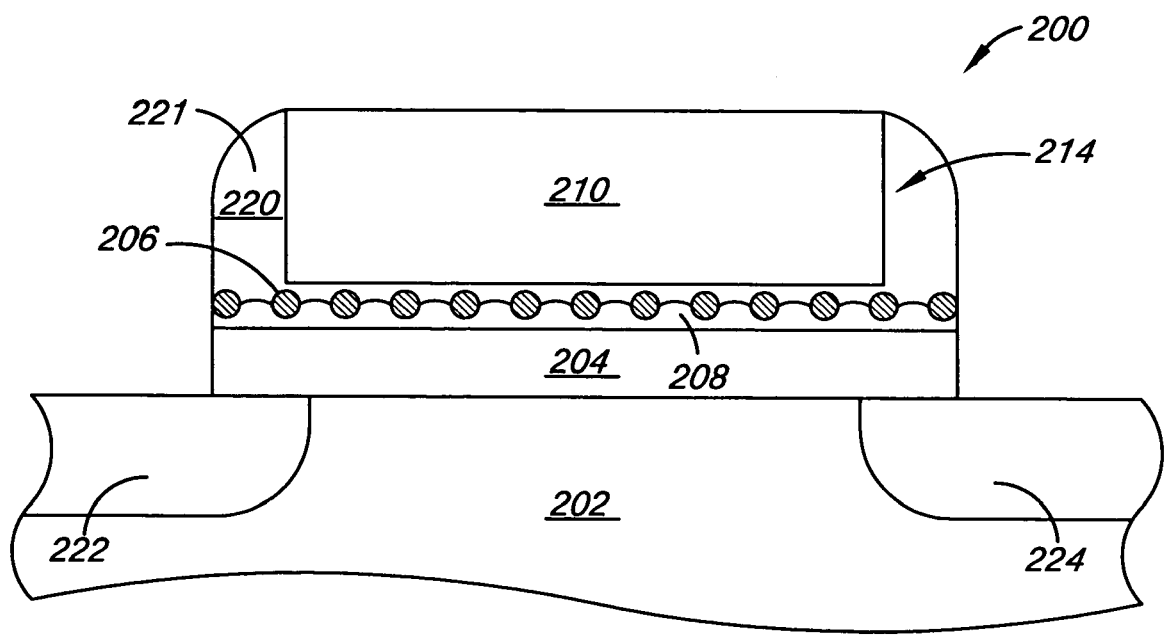

However, since the spacing layer 220 can be deposited before the isotropic etch, the sidewall 214 which includes a location where a nanodot 206 has been deposited may also contain a nanodot 206. In such embodiments, therefore, the spacing layer 220 can have a thickness at least equal to about the diameter of the nanodots 206. In this way, the spacing layer 220 can be thick enough to cover a nanodot 206 encased in the second dielectric layer 208 in the sidewall 214 of the gate stack 212. In such embodiments, once the spacing layer 220 is deposited, the isotropic etch can be performed as discussed herein to form the memory cell 200 shown in FIG. 2B.

The memory cell device 100, 200 can be efficiently fabricated and can use the nanodots 106, 206 as the electron trapping layer. Accordingly, the semiconductor device of the embodiment is suitable as a non-volatile memory and can be scaled for future technologies. The device 100, 200 can be used as an electron storage device which stores one electron per nanodot, or as a device which stores more than one electron per nanodot. Furthermore, a device according to the present disclosure can be more reliable in that if one of the nanodots fails, the other nanodots will not be affected.

Figure 3:
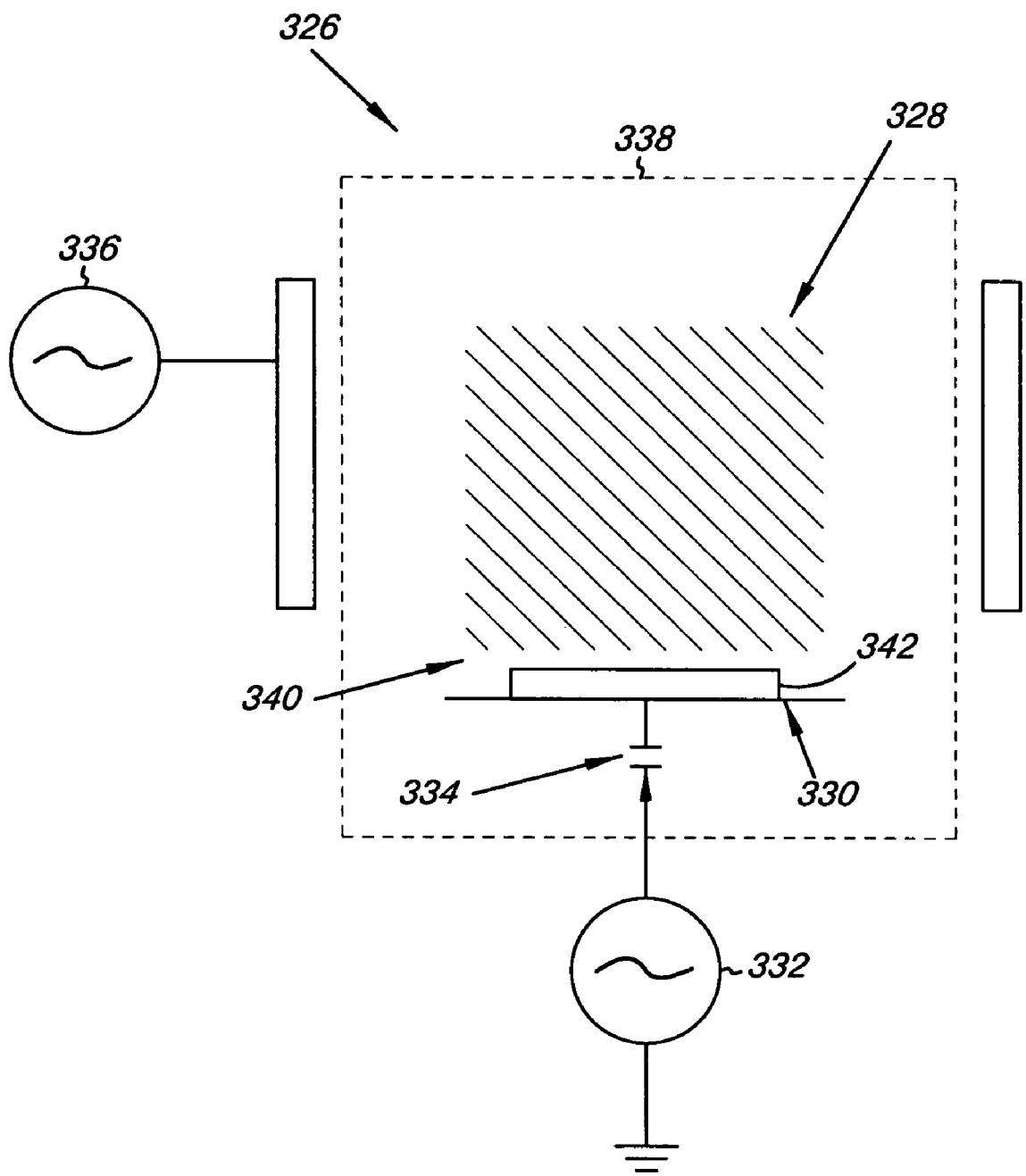
FIG. 3 illustrates a general diagram of a plasma generation device in which embodiments of the present disclosure may be used.

FIG. 3 shows an illustrative etch reactor 326 for performing etching. It should be recognized that this is an illustrative diagram representative of an entire system even though only several components of the system are shown. Various systems incorporating many elements in various configurations may be utilized. To generate plasma 328, a gas is provided to the etch reactor 326. In one embodiment, a first gaseous etchant is provided to the etch reactor 326 to perform a dry etch to form a sidewall of the gate stack, as discussed herein. In addition, in one embodiment a second gaseous etchant is provided to the etch reactor 326 to perform a wet or dry etch to etch the spacing layer. In addition, in one embodiment, the gas provided to the plasma generation apparatus 326 is changed to supply a third gaseous etchant, where the third gaseous etchant forms a plasma 328 that is selective to the second dielectric layer and the spacing layer, to etch the nanodots more aggressively than the second dielectric layer. As discussed herein, the spacing layer can also be etched after the isotropic etchant is performed with the third gaseous etchant.

The illustrative etch reactor 326 includes a powered electrode 330 connected to an RF bias source 332 via capacitance 334 upon which a semiconductor substrate having an insulating layer to be etched is placed. Further, a power source 336 is connected to elements, e.g., coils, for generating the plasma 328 in chamber 338. Ion sheath 340 is formed between the plasma 328 and the powered electrode 330. With the semiconductor substrate 342 positioned within the etch reactor 326, the insulating layer is etched in accordance with the embodiments resulting in the structure of FIGS. 1E and 2B. The power source 336 utilized may be a suitable power source including an RF generator, a microwave generator, etc. It will be readily apparent that other etch reactor systems may also be used.

Figure 4:
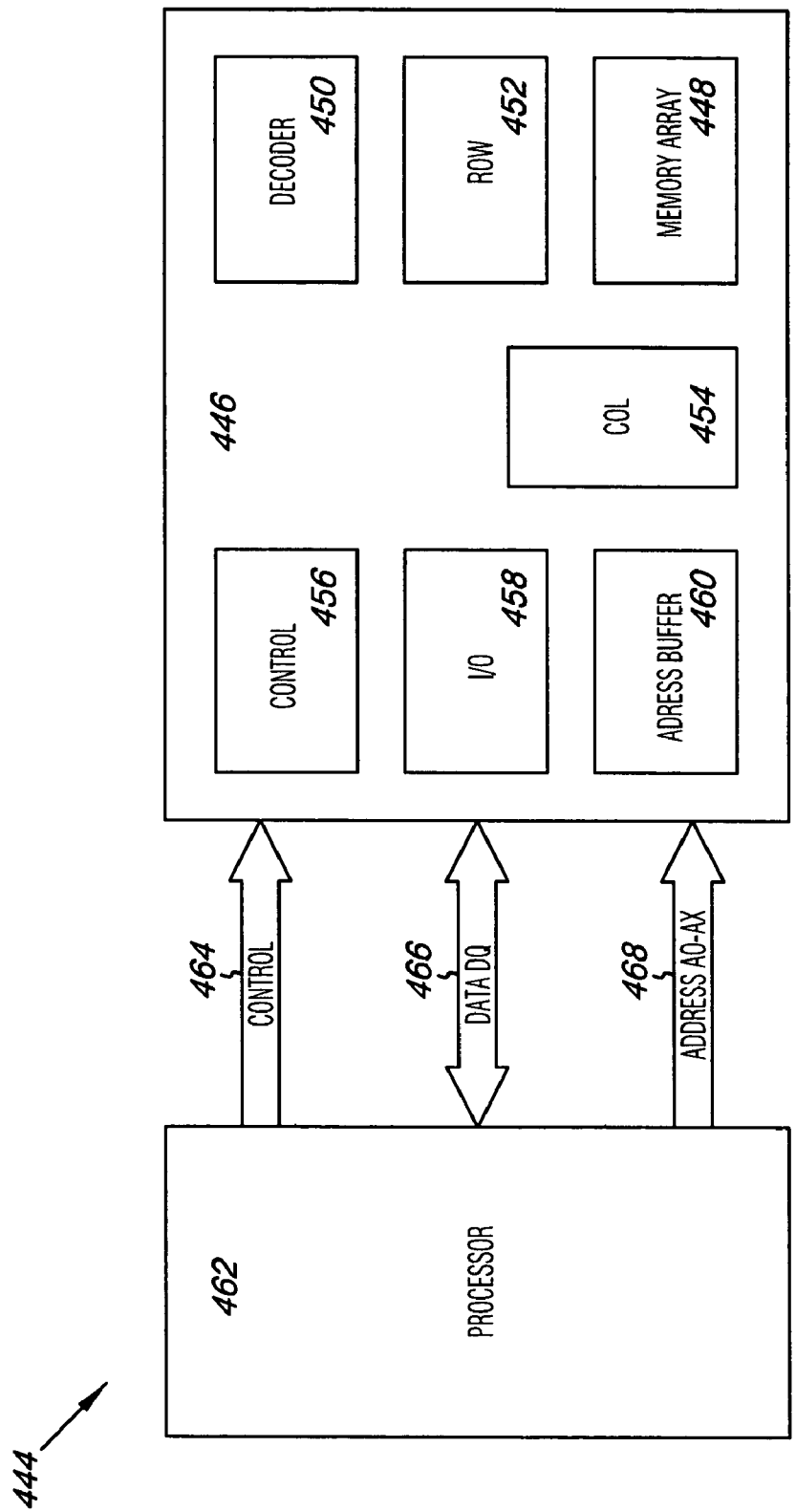
FIG. 4 illustrates a functional block diagram of an electronic system having at least one memory device in accordance with an embodiment of the present disclosure.

In some embodiments, the electron storage device of the present disclosure can be used as a non-volatile memory cell in a non-volatile memory device. FIG. 4 illustrates an exemplary electronic system 444 which utilizes a non-volatile memory device 446 containing the memory cell 100 of FIG. 1D or memory cell 200 of FIG. 2B. Electronic system 444 includes a non-volatile memory device 446 that includes an array of non-volatile memory cells 448, an address decoder 450, row access circuitry 452, column access circuitry 454, control circuitry 456, Input/Output (I/O) circuitry 458, and an address buffer 460.

The array 448 of non-volatile memory cells has a NAND architecture in accordance with an embodiment of the disclosure. The memory cells (not shown in FIG. 4) of the array 448 of non-volatile memory cells may be floating-gate memory cells, NROM cells or other type of one-transistor non-volatile memory cells.

Electronic system 444 includes an external processor 462, e.g., a memory controller or host processor, electrically connected to memory device 446 for memory accessing. The memory device 446 receives control signals from the processor 462 over a control link 464. The memory cells are used to store data that are accessed via a data (DQ) link 466. Address signals are received via an address link 468 that are decoded at address decoder 450 to access the memory array 448. Address buffer circuit 460 latches the address signals. The memory cells are accessed in response to the control signals and the address signals.

The control link 464, data link 466 and address link 468 can be collectively referred to as access lines. It will be appreciated by those skilled in the art that additional circuitry and control signals can be provided, and that the memory device detail of FIG. 4 has been reduced to facilitate ease of illustration. As stated herein, the basic flash memory device 446 has been simplified to facilitate a basic understanding of the features of the memory device. A more detailed understanding of flash memories is known to those skilled in the art. As is well known, such basic flash memory device 446 may be fabricated as integrated circuits on a semiconductor substrate. The memory cells described above are used in various embodiments in the basic memory array or system structure described in FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

CONCLUSION

Memory cell structures and methods of fabrication have been described that include forming floating gates in the form of nanodots to accommodate the diminishing feature size of elements on a chip.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell which comprises:
   a floating gate formed by nanodots in a second dielectric material on a first dielectric layer above a channel region, the second dielectric material being different from the material of the first dielectric layer;

a spacer, formed of a material different than the second dielectric material, formed on a sidewall defined by the second dielectric material and filling a void interior to the sidewall at a location where a nanodot had been deposited but subsequently removed in processing; and an intergate dielectric layer between the floating gate and a control gate layer.

2. The memory cell of claim 1, wherein a distance separating the nanodots and the channel is at least two (2) nanometers (nm).

3. The memory cell of claim 2, wherein a distance separating the nanodots and the channel is in the range of four (4) nm to two (2) nm.

4. The memory cell of claim 1, wherein the first dielectric layer is formed of an oxide.

5. The memory cell of claim 1, wherein the intergate dielectric layer includes a stack of dielectric layers.

6. The memory cell of claim 5, wherein the intergate dielectric layer includes a silicon dioxide layer over a dielectric material having a dielectric constant of 25 or greater.

7. The memory cell of claim 1, wherein the control gate layer is overlying the intergate dielectric layer.

8. A memory cell, comprising:
a first dielectric layer on a semiconductor substrate;
a second dielectric layer containing a number of nanodots, where the first dielectric layer and the second dielectric layer define a sidewall of the memory cell with at least a portion of a void interior to the sidewall at a location where a nanodot had been deposited;
an intergate dielectric layer on the second dielectric layer; and
a spacer formed on the sidewall, where the spacer fills the portion of the void and is formed of a dielectric material different from the second dielectric layer.

9. The memory cell of claim 8, wherein the spacer has a thickness (T) that is a function of a diameter (d) of a nanodot that ranges from T=d to T=1.5 d.

10. The memory cell of claim 8, wherein the number of nanodots are formed of at least one metal selected from the group consisting of platinum, ruthenium, rhodium, iridium, chromium, titanium, molybdenum, tungsten, and osmium.

11. The memory cell of claim 8, wherein the number of nanodots are formed of a material having a melting point of at least one thousand six hundred (1,600) degrees Celsius (° C.).

12. The memory cell of claim 8, wherein the memory cell is configured to store a single electron per nanodot.

13. An electronic system, comprising:
a processor; and
a memory device coupled to the processor, the memory device includes:
an array of memory cells, at least one memory cell including:
a floating gate formed of nanodots in a layer of a first dielectric material above a channel region, the layer of a first dielectric material defining a sidewall;
a second dielectric material, different from the first, filling a void interior to the a sidewall at a location where a nanodot had been deposited but subsequently removed in processing;
an intergate dielectric layer between the floating gate and a control gate;

wherein a distance separating the nanodots and the channel region is at least two (2) nm and the first dielectric material is formed of an oxide; and
circuitry for control and/or access of the array of memory cells.

14. The electronic system of claim 13, including a tunneling oxide layer between the channel region and the nanodots.

15. A memory device, comprising:
an array of memory cells arranged in rows coupled by word lines and columns coupled by bit lines;
circuitry for control and/or access of the array of memory cells; and
wherein at least one memory cell of the array of memory cells includes:
a floating gate formed by nanodots in a layer of a first dielectric material above a channel region, the layer of a first dielectric material defining a sidewall;
a second dielectric material, different from the first, filling a void interior to the sidewall at a location where a nanodot had been deposited but subsequently removed in processing;
an intergate dielectric layer between the floating gate and a control gate; and
wherein a distance separating the nanodots and the channel region is at least two (2) nm and the first dielectric material is formed of an oxide.

16. The memory cell of claim 1, wherein:
the first dielectric layer has a thickness of less than ten (10) nm; and
the second dielectric material has a thickness of ten (10) nm or less.

17. The memory cell of claim 1, wherein;
the first dielectric layer is formed of at least one material selected from a group of dielectrics that includes silicon nitride (SiN) and silicon dioxide ($SiO_2$); and
the second dielectric material is formed of at least one material selected from a group of dielectrics that includes tantalum pent-oxide ($Ta_2O_5$), $BaSrTiO_s$, hafnium oxide ($HfO_2$), and zirconium oxide ($ZrO_2$).

18. The memory cell of claim 1, wherein the nanodots each have a diameter that is in the range of two (2) nm to five (5) nm.

19. The memory cell of claim 1, wherein the nanodots are formed to be separate and isolated from each other.

20. The memory cell of claim 19, wherein the second dielectric material is formed interstitially between the nanodots.

21. The memory cell of claim 1, wherein the intergate dielectric layer is formed of at least one material selected from a group of dielectrics that includes silicon nitride (SiN), silicon dioxide ($SiO_2$), tantalum pent-oxide ($Ta_2O_5$), $BaSrTiO_s$, hafnium oxide ($HfO_2$), and zirconium oxide ($ZrO_2$).

22. The memory cell of claim 8, wherein the spacer has a thickness equal to at least the diameter of the nanodots.

23. The electronic system of claim 13, wherein the second dielectric material is selected from a group that includes at least one of tantalum pent-oxide ($Ta_2O_5$), $BaSrTiO_s$, hafnium oxide ($HfO_2$), and zirconium oxide ($ZrO_2$).

* * * * *

UNITED STATES PATENT AND TRADEMARK OFFICE
CERTIFICATE OF CORRECTION

PATENT NO.         : 7,560,769 B2                                                Page 1 of 1
APPLICATION NO. : 11/498523
DATED                 : July 14, 2009
INVENTOR(S)       : Gurtej S. Sandhu et al.

It is certified that error appears in the above-identified patent and that said Letters Patent is hereby corrected as shown below:

In column 9, line 37, in Claim 9, delete "T=1.5 d." and insert -- T=1.5d. --, therefor.

In column 9, line 53, in Claim 13, delete "nanadots" and insert -- nanodots --, therefor.

In column 9, line 57, in Claim 13, after "to the" delete "a".

In column 10, line 31, in Claim 16, delete "often" and insert -- of ten --, therefor.

In column 10, line 33, in Claim 17, delete "wherein;" and insert -- wherein: --, therefor.

In column 10, line 39, in Claim 17, delete "BaSrTiOs," and insert -- $BaSrTiO_5$, --, therefor.

In column 10, lines 52-53, in Claim 21, delete "BaSrTiOs," and insert -- $BaSrTiO_5$, --, therefor.

In column 10, line 58, in Claim 23, delete "BaSrTiOs," and insert -- $BaSrTiO_5$, --, therefor.

Signed and Sealed this

First Day of September, 2009

David J. Kappos
*Director of the United States Patent and Trademark Office*